(12) United States Patent
Ji et al.

(10) Patent No.: US 12,733,352 B2
(45) Date of Patent: Sep. 8, 2026

(54) DISPLAY APPARATUS HAVING MULTI-PAD PIXEL ELECTRODES

(71) Applicant: LG DISPLAY CO., LTD., Seoul (KR)

(72) Inventors: Seokwon Ji, Paju-si (KR); Saemleenuri Lee, Paju-si (KR); MoonSoo Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 686 days.

(21) Appl. No.: 18/076,776

(22) Filed: Dec. 7, 2022

(65) Prior Publication Data

US 2023/0217731 A1 Jul. 6, 2023

(30) Foreign Application Priority Data

Dec. 30, 2021 (KR) ........................ 10-2021-0193037

(51) Int. Cl.

*H10K 59/123* (2023.01)
*H10K 59/124* (2023.01)
*H10K 59/131* (2023.01)
*H10K 59/38* (2023.01)

(52) U.S. Cl.

CPC ......... *H10K 59/123* (2023.02); *H10K 59/124* (2023.02); *H10K 59/131* (2023.02); *H10K 59/38* (2023.02)

(58) Field of Classification Search

CPC .. H10K 59/123; H10K 59/124; H10K 59/131; H10K 59/38; H10K 50/8426; H10K 50/81; H10K 50/841; H10K 71/50; H10D 86/411; H10D 86/60

See application file for complete search history.

(56) References Cited

U.S. PATENT DOCUMENTS

2008/0157080 A1* 7/2008 Gruner ................. H10D 86/441 257/59
2019/0207150 A1 7/2019 Kwon et al.
2021/0143373 A1 5/2021 Kim et al.
2022/0069043 A1* 3/2022 Kim ..................... H10K 59/878

FOREIGN PATENT DOCUMENTS

| | | | |
|---|---|---|---|
| CN | 110021711 | A | 7/2019 |
| CN | 112864195 | A | 5/2021 |
| KR | 2007-0024810 | A | 3/2007 |
| KR | 2007-0037091 | A | 4/2007 |
| KR | 10-2007-0046505 | A | 5/2007 |

* cited by examiner

*Primary Examiner* — Brigitte A Paterson
(74) *Attorney, Agent, or Firm* — Fish & Richardson P.C.

(57) ABSTRACT

A display apparatus includes a first substrate provided with a display area including a plurality of subpixels formed by crossing of a gate line, a data line and a power line, and a non-display area surrounding the display area, a driving thin film transistor provided on the first substrate, a planarization layer provided on the driving thin film transistor, a plurality of first electrodes provided on the planarization layer, a light emitting layer provided on the plurality of first electrodes, a second electrode provided on the light emitting layer, and a second substrate provided on the second electrode, wherein the plurality of first electrodes are electrically connected to each other through a connection portion formed between the planarization layer and the plurality of first electrodes.

11 Claims, 6 Drawing Sheets

DISPLAY APPARATUS HAVING MULTI-PAD PIXEL ELECTRODES

CROSS-REFERENCE TO RELATED APPLICATION

This application claims the priority of Korean Patent Application No. 10-2021-0193037 filed on Dec. 30, 2021, which is hereby incorporated by reference in its entirety.

BACKGROUND

Field of the Disclosure

The present disclosure relates to a display apparatus.

Description of the Background

With the advancement of the information age, the demand for a display apparatus for displaying an image has increased in various forms. Therefore, various types of display apparatuses such as a liquid crystal display (LCD) apparatus, a plasma display panel (PDP) apparatus, and an electroluminescence display (ELD) apparatus have been recently used. The electroluminescence display (ELD) apparatus may include an organic light emitting display (OLED) apparatus and a quantum-dot light emitting display (QLED) apparatus.

Among the display apparatuses, the electroluminescence display apparatus is a self-light emitting type and has advantages in that a viewing angle and a contrast ratio are more excellent than those of the liquid crystal display (LCD) apparatus. Also, since the electroluminescence display apparatus does not require a separate backlight, it is advantageous that the electroluminescence display apparatus is able to be thin and lightweight and has low power consumption. Further, the electroluminescence display apparatus has advantages in that it may be driven at a direct current low voltage, has a fast response speed, and especially has a low manufacturing cost.

In the process of manufacturing the electroluminescent display apparatus, when a light emitting layer is deposited on an anode, external particles may be seated on the anode. In this case, the light emitting layer and a cathode are deposited on the particles, and a pixel is not normally manufactured, whereby a problem may occur in that dark spots are formed. In the related art, a method of normalizing dark spots by applying a high reverse voltage to an area, on which particles are seated, to remove a light emitting layer and a cathode, which are deposited on the particles, are used to solve the above problem.

When the electroluminescence display apparatus is provided in a bottom emission mode in which light is emitted in a lower direction, the cathode is made of a metal material, so that the cathode positioned in an area adjacent to the particles may be oxidized to non-conductorize a surface of the cathode, whereby it is likely that dark spots may be normalized.

However, when the electroluminescence display apparatus is provided in a top emission mode in which light is emitted in an upper direction, the cathode is made of a transparent conductive material. In this case, since it is difficult to non-conductorize the surface of the cathode positioned in the area adjacent to the particles, the possibility that the dark spots will be normalized becomes lowered. Therefore, even though a process of normalizing the dark spots is performed, a problem occurs in that some dark spots still exist without being normalized.

SUMMARY

The present disclosure has been formed in view of the above problems and is to provide a light emitting display apparatus that minimizes occurrence of dark spots due to particles.

Additional features of the present disclosure will be clearly understood by those skilled in the art from the following description of the present disclosure.

In accordance with an aspect of the present disclosure, the above and other features can be accomplished by the provision of a display apparatus comprising a first substrate provided with a display area including a plurality of subpixels formed by crossing of a gate line, a data line and a power line, and a non-display area surrounding the display area, a driving thin film transistor provided on the first substrate, a planarization layer provided on the driving thin film transistor, a plurality of first electrodes provided on the planarization layer, a light emitting layer provided on the plurality of first electrodes, a second electrode provided on the light emitting layer, and a second substrate provided on the second electrode, wherein the plurality of first electrodes are electrically connected to each other through a connection portion formed between the planarization layer and the plurality of first electrodes.

BRIEF DESCRIPTION OF THE DRAWINGS

The above and other features and advantages of the present disclosure will be more clearly understood from the following detailed description taken in conjunction with the accompanying drawings, in which.

DETAILED DESCRIPTION

Figure 1:
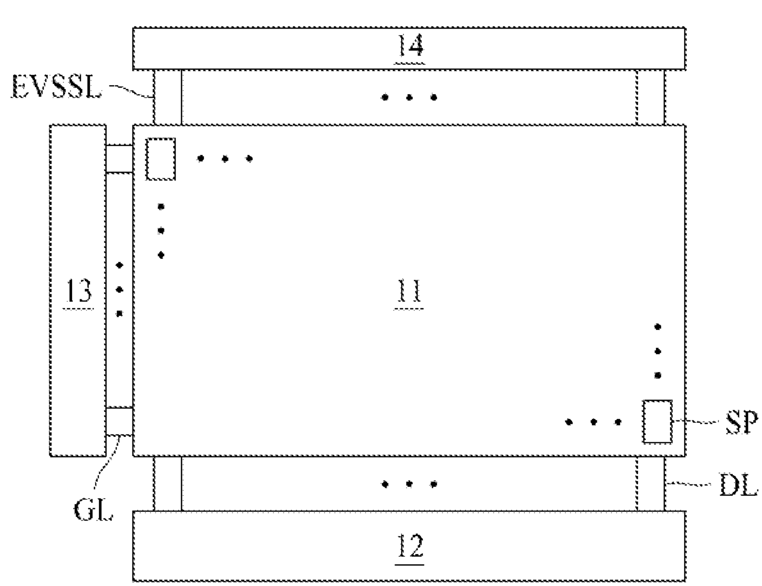
FIG. 1 is a plan view illustrating a light emitting display apparatus according to one aspect of the present disclosure.

Advantages and features of the present disclosure and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete and will fully convey the scope of the present disclosure to those skilled in the art. Further, the present disclosure is only defined by scopes of claims.

A shape, a size, a ratio, an angle and a number disclosed in the drawings for describing aspects of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have' and 'include' described in the present disclosure are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~' and 'next to~', one or more portions may be arranged between two other portions unless 'just' or 'direct' is used.

In describing a temporal relationship, for example, when the temporal order is described as 'after~', 'subsequent~', 'next~' and 'before~' a case which is not continuous may be included unless 'just' or 'direct' is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various aspects of the present disclosure may be partially or overall coupled to or combined with each other and may be variously inter-operated with each other and driven technically as those skilled in the art can sufficiently understand. The aspects of the present disclosure may be carried out independently from each other or may be carried out together in co-dependent relationship.

Hereinafter, aspects of the present disclosure will be described with reference to the drawings.

FIG. 1 is a plan view illustrating a light emitting display apparatus according to one aspect of the present disclosure.

Referring to FIG. 1, the light emitting display 10 according to one aspect of the present disclosure may include a display panel 11, a data driver 12, a gate driver 13 and a shorting bar 14.

The display panel 11 may include a plurality of gate lines GL arranged in one direction, a plurality of data lines DL arranged to be perpendicular to the plurality of gate lines GL, a plurality of high potential power voltage lines EVDDL and a plurality of low potential power voltage lines EVSSL, which are arranged to be parallel with the plurality of data lines DL, and a plurality of subpixels SP.

The data driver 12 may drive the plurality of data lines DL by supplying a driving data voltage to the plurality of data lines DL. Further, the gate driver 13 may sequentially drive the plurality of gate lines GL by sequentially supplying a scan signal to the plurality of gate lines GL.

Referring to FIG. 1, the data driver 12 and the gate driver 13 are positioned on left and lower sides of the display panel 11, but are not limited thereto.

The plurality of low potential power voltage lines EVSSL may be extended to one side of the display panel 11, and may be electrically connected to the shorting bar 14. Through the shorting bar 14, a low potential power voltage may be easily supplied to the plurality of low potential power voltage lines EVSSL, which will be described in detail with reference to FIGS. 2 and 3. Also, the shorting bar 14 may protect elements constituting subpixels from static electricity which may occur during a manufacturing process of the light emitting display apparatus, and may be used for an inspection process for detecting the presence of a short of each of the plurality of low potential power voltage lines EVSSL. Referring to FIG. 1, the shorting bar 14 is positioned above the display panel 11, but is not limited thereto. The shorting bar 14 may be disposed on four sides of the display panel 11.

Figure 2:
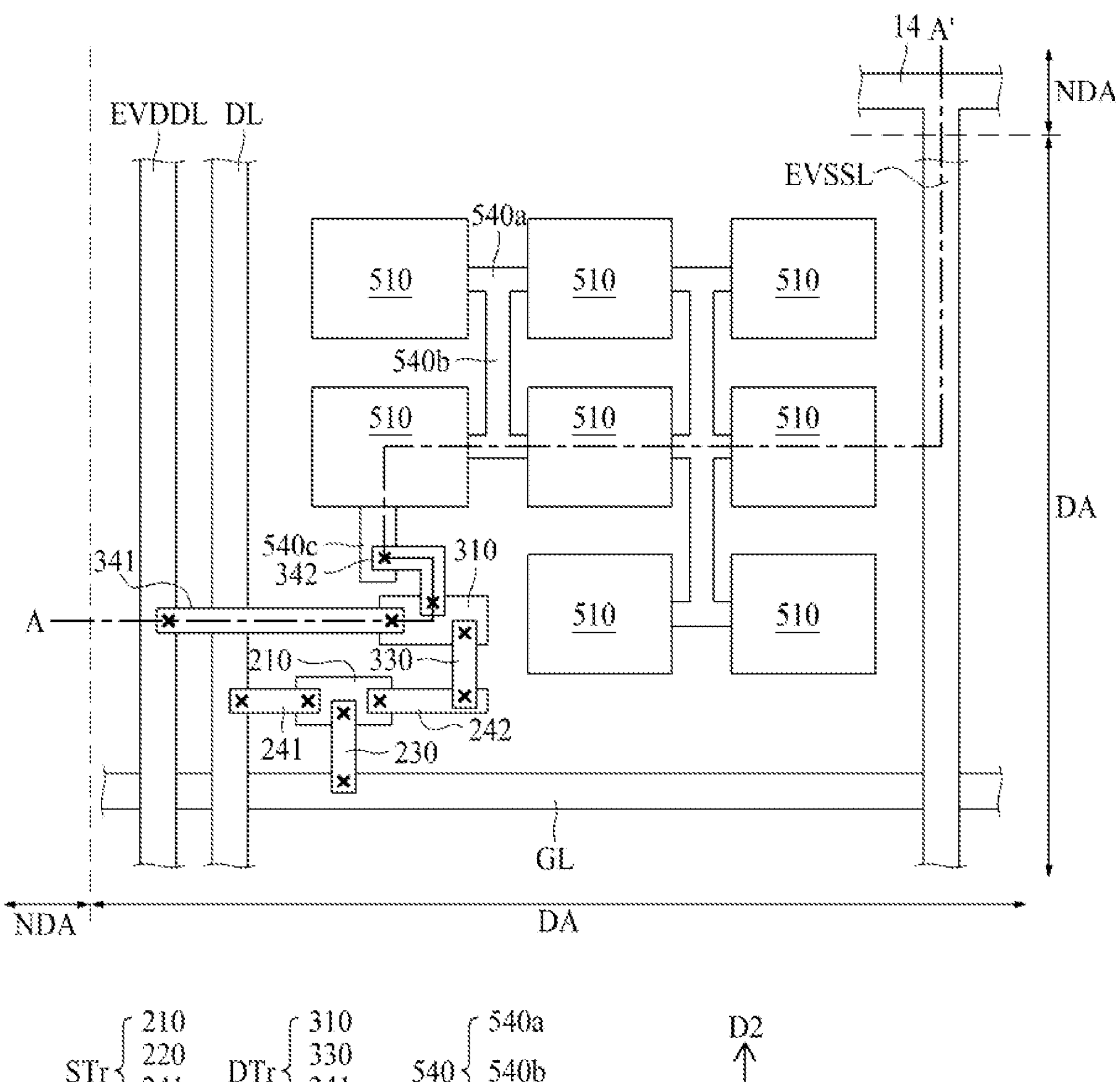
FIG. 2 is a plan view illustrating one subpixel of a light emitting display apparatus according to one aspect of the present disclosure.

FIG. 2 is a plan view illustrating one subpixel SP of a light emitting display apparatus according to one aspect of the present disclosure.

Referring to FIG. 2, the light emitting display apparatus according to one aspect of the present disclosure may include a first substrate 100 (see FIG. 3), a high potential power voltage line EVDDL, a low potential power voltage line EVSSL, a gate line GL, a data line DL, a switching thin film transistor STr, a driving thin film transistor DTr, a plurality of first electrodes 510 and a second electrode 530.

The substrate 100 may be made of glass or plastic, but is not limited thereto. The substrate 100 may be made of a semiconductor material such as a silicon wafer.

The substrate 100 may include a display area DA in which a plurality of subpixels SP are provided, and a non-display area NDA surrounding the display area DA. In FIG. 2, one subpixel SP is shown.

The subpixel SP may be defined by a gate line GL arranged in a first direction D1, a data line DL arranged in a second direction D2 perpendicular to the first direction D1, a high potential power voltage line EVDDL and a low potential power voltage line EVSSL.

One side of the low potential power voltage line EVSSL may be extended from the display area DA and formed to reach the non-display area NDA. Also, an end of the low potential power voltage line EVSSL provided in the non-display area NDA may be connected to the shorting bar 14.

The switching thin film transistor STr is disposed in an area where the gate line GL and the data line DL cross each other. The switching thin film transistor STr may serve as a switching element for applying a signal to the subpixel.

The switching thin film transistor STr may include a semiconductor layer 210, a gate insulating layer 220, a gate electrode 230, a source electrode 241 and a drain electrode 242. The switching thin film transistor STr may be connected to the gate line GL and the data line DL. For example, the gate electrode 230 of the switching thin film transistor STr may be connected to the gate line GL, and the source electrode 241 of the switching thin film transistor STr may be connected to the data line DL.

One side of the semiconductor layer 210 of the switching thin film transistor STr may be connected to the source electrode 241 of the switching thin film transistor STr through a contact hole, and the other side of the semiconductor layer 210 may be connected to the drain electrode 242 of the switching thin film transistor STr through the contact hole.

The switching thin film transistor STr may be turned on or off by a scan signal supplied through the gate line GL. Therefore, when a data voltage is supplied through the data line DL, the switching thin film transistor STr may control that the data voltage is applied to the subpixel through the scan signal.

The driving thin film transistor DTr serves to drive the subpixel based on the signal applied by the switching thin film transistor STr. Referring to FIG. 2, the gate electrode 330 of the driving thin film transistor DTr may be connected to the drain electrode 242 of the switching thin film transistor STr through a contact hole. In addition, the source electrode 341 of the driving thin film transistor DTr may be connected to the high potential power voltage line EVDDL, and the drain electrode 342 of the driving thin film transistor DTr may be connected to the first electrode 510 through the contact hole.

One side of the semiconductor layer 310 of the driving thin film transistor DTr may be connected to the source electrode 341 of the driving thin film transistor DTr through the contact hole, and the other side of the semiconductor layer 310 of the driving thin film transistor DTr may be connected to the drain electrode 342 of the driving thin film transistor DTr through the contact hole.

The plurality of first electrodes 510 are provided on the switching thin film transistor STr and the driving thin film transistor DTr. The plurality of first electrodes 510 may be a single layer or multi-layer made of a metal material such as molybdenum (Mo) and titanium (Ti) or their alloy, and may be made of a transparent conductive material such as indium tin oxide (ITO) and indium zinc oxide (IZO).

The plurality of first electrodes 510 may be arranged in the form of a matrix. In detail, as shown in FIG. 2, the plurality of first electrodes 510 may be disposed at constant intervals along the first direction D1 and the second direction D2. In addition, each of the plurality of first electrodes 510 may be formed to have the same size.

A connection portion 540 may be disposed below the plurality of first electrodes 510 to electrically connect the plurality of first electrodes 510. The connection portion 540 may be made of a transparent conductive material such as a metal material such as molybdenum (Mo) or titanium (Ti) or a transparent conductive material such as indium tin oxide (ITO) or indium zinc oxide (IZO).

The connection portion 540 may include a plurality of first connection portions 540*a*, a plurality of second connection portions 540*b* and a contact portion 540*c*. The plurality of first connection portions 540*a* may be provided to be parallel with the first direction D1 to electrically connect the first electrodes 510 adjacent to each other in the first direction D1. That is, one side of each of the plurality of first connection portions 540*a* may be connected to one first electrode 510, and the other side of each of the plurality of first connection portions 540 may be connected to the other first electrode 510.

In FIG. 2, the plurality of first connection portions 540*a* electrically connect the first electrodes 510 adjacent to each other in the first direction D1, but are not limited thereto. For example, the plurality of first connection portions 540*a* may electrically connect the first electrodes 510 adjacent to each other in the second direction D2.

The plurality of second connection portions 540*b* may be provided between two first electrodes 510 adjacent to each other in the first direction D1. Each of the plurality of second connection portions 540*b* may be extended from one side of any one of the first connection portions 540*a* to connect the first connection portion 540*a* adjacent to each other in the second direction D2. Therefore, since the plurality of first connection portions 540*a* electrically connect the plurality of first electrodes 510 adjacent to each other and the plurality of second connection portions 540*b* electrically connect the plurality of first connection portions 540*a* adjacent to each other, the plurality of first electrodes 510 may be electrically connected to each other.

In FIG. 2, the plurality of second connection portions 540*b* are formed between the first electrodes 510 adjacent to each other, but are not limited thereto. For example, a portion of the plurality of second connection portions 540*b* may be formed to overlap the plurality of first electrodes 510.

In addition, the contact portion 540*c* may electrically connect the plurality of first electrodes 510 with the drain electrode 342 of the driving thin film transistor DTr. One side of the contact portion 540*c* may be connected to one of the first electrodes 510, and the other side of the contact portion 540*c* may be formed in a direction in which the driving thin film transistor DTr is provided, so that the other side of the contact portion 540*c* may be connected to the drain electrode 342 of the driving thin film transistor DTr through the contact hole. Therefore, the plurality of first electrodes 510 may be supplied with a power source from the driving thin film transistor DTr through the contact portion 540*c*.

In FIG. 2, the contact portion 540*c* is connected to one first electrode 510, but is not limited thereto. For example, the contact portion 540*c* may be connected to two or more first electrodes 510. Therefore, even though one of the two or more first electrodes 510 connected to the contact portion 540*c* is not normally operated, the plurality of first electrodes 510 may be stably supplied with a power source through the other first electrodes 510 connected to the contact portion 540*c*.

Figure 3:
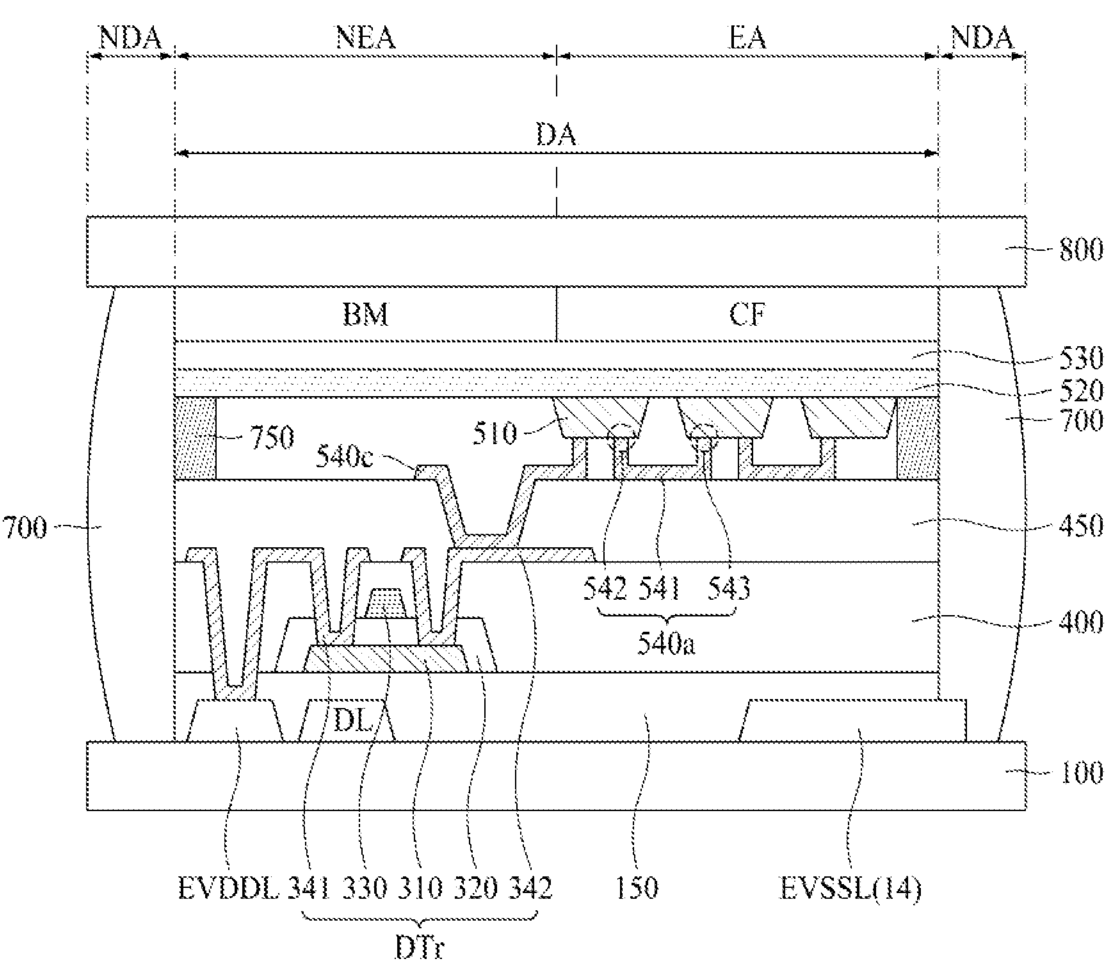
FIG. 3 is a cross-sectional view taken along line A-A' of FIG. 2, illustrating one subpixel of a light emitting display apparatus according to one aspect.

FIG. 3 is a cross-sectional view taken along line A-A' of FIG. 2, illustrating one subpixel of a light emitting display apparatus according to one aspect of the present disclosure.

Referring to FIG. 3, a high potential power voltage line EVDDL, a low potential power voltage line EVS SL, a data line DL, a buffer layer 150, a driving thin film transistor DTr, a plurality of first electrodes 510, a light emitting layer 520, a second electrode 530, a connection portion 540, a color filter CF, a black matrix BM, a dam 700, a partition 750 and a second substrate 800 are provided on a first substrate 100.

The first substrate 100 may be made of glass or plastic, but is not limited thereto. The first substrate 100 may be made of a semiconductor material such as a silicon wafer.

The substrate 100 may include a display area DA in which a plurality of subpixels SP are provided, and a non-display area NDA surrounding the display area DA. In FIG. 3, one subpixel SP is shown. The display area DA may include a light emission area EA for emitting light and a non-light emission area NEA surrounding the light emission area EA.

In the display area DA, the high potential power voltage line EVDDL, the low potential power voltage line EVSSL and the data line DL are provided on the first substrate 100. As described above with reference to FIG. 2, the high potential power voltage line EVDDL may be electrically connected to the source electrode 341 of the driving thin film transistor DTr to supply a high potential power voltage. The data line DL may be electrically connected to the source electrode 241 of the switching thin film transistor STr to supply a data voltage. In addition, one side of the low potential voltage line EVSSL may be extended from the display area DA and formed to reach the non-display area NDA. An end of the low potential power voltage line EVSSL provided in the non-display area NDA may be connected to the shorting bar 14.

In the display area DA, the buffer layer 150 is provided on the high potential power voltage line EVDDL, the low potential power voltage line EVSSL and the data line DL. The buffer layer 150 may be formed of a single layer of silicon nitride (SiNx) or silicon oxide (SiOx), or a multi-layer of silicon nitride (SiNx) and silicon oxide (SiOx).

The buffer layer 150 may compensate for a step difference between the first substrate 100 and the high potential power voltage line EVDDL, the low potential power voltage line EVSSL and the data line DL. In addition, the buffer layer 150 may cover both upper surfaces and sides of the high potential power voltage line EVDDL and the data line DL. Further, the buffer layer 150 may expose a portion of the low potential power voltage line EVSSL formed in the non-display area NDA and the shorting bar 14.

The driving thin film transistor DTr may be provided on the buffer layer 150 in the non-light emission area NEA. The driving thin film transistor DTr may include a semiconductor layer 310, a gate insulating layer 320, a gate electrode 330, a source electrode 341 and a drain electrode 342.

The semiconductor layer 310 of the driving thin film transistor DTr is provided on the buffer layer 150. The semiconductor layer 310 may include a poly-silicon semiconductor or an oxide semiconductor. When the semiconductor layer 310 includes an oxide semiconductor, the semiconductor layer 310 may include at least one of indium-gallium-zinc-oxide (IGZO), indium-zinc-oxide (IZO), indium-gallium-tin-oxide (IGTO) and indium-gallium-oxide (IGO).

The gate insulating layer 320 of the driving thin film transistor DTr may be provided on the semiconductor layer 310 to insulate the gate electrode 330 from the semiconductor layer 310. The gate insulating layer 320 of the driving thin film transistor DTr may be formed of a single layer of silicon nitride (SiNx) or silicon oxide (SiOx), or a multi-layer of silicon nitride (SiNx) and silicon oxide (SiOx).

The gate electrode 330 of the driving thin film transistor DTr is provided on the gate insulating layer 320. The gate electrode 330 may be formed on the gate insulating layer 320 to overlap a channel area of the semiconductor layer 310.

An interlayer insulating layer 400 is provided on the gate insulating layer 320 and the gate electrode 330 of the driving thin film transistor DTr. The interlayer insulating layer 400 may be formed of a single layer of silicon nitride (SiNx) or silicon oxide (SiOx), or a multi-layer of silicon nitride (SiNx) and silicon oxide (SiOx).

A contact hole for exposing the semiconductor layer 310 of the driving thin film transistor DTr may be formed in the gate insulating layer 320 and the interlayer insulating layer 400 of the driving thin film transistor DTr.

The source electrode 341 and the drain electrode 342 of the driving thin film transistor DTr are provided on the interlayer insulating layer 400 while facing each other. Also, each of the source electrode 341 and the drain electrode 342 of the driving thin film transistor DTr may be connected to the semiconductor layer 310 through a contact hole formed in the gate insulating layer 320 and the interlayer insulating layer 400.

A contact hole passing through the buffer layer 150 and the interlayer insulating layer 400 may be formed to expose the high potential power voltage line EVDDL. The source electrode 341 of the driving thin film transistor DTr may be extended in a direction in which the contact hole is formed, and may be electrically connected to the high potential power voltage line EVDDL through the contact hole. A lower surface of the contact hole exposes the high potential power voltage line EVDDL, and inner sides of the contact hole are comprised of sides of the buffer layer 150 and the interlayer insulating layer 400.

A planarization layer 450 is provided on the interlayer insulating layer 400. The planarization layer 450 may compensate for a step difference due to the driving thin film transistor DTr and the contact holes. The planarization layer 450 may be made of an inorganic insulating material or an organic insulating material. Alternatively, the planarization layer 450 may be formed as a layer made of an organic insulating material and a layer made of an inorganic insulating material are stacked.

The connection portion 540 is provided on the planarization layer 450. As described above with reference to FIG. 2, the connection portion 540 includes a plurality of first connection portions 540*a*, a plurality of second connection portions 540*b* and a contact portion 540*c*, but FIG. 3 shows only the plurality of first connection portions 540*a* and the contact portions 540*c*.

The plurality of first connection portions 540*a* may be formed to be spaced apart from each other at constant intervals in the light emission area EA, and each of the plurality of first connection portions 540*a* may include a bottom portion 541, a first protrusion 542 and a second protrusion 543.

The bottom portion 541 may be provided on the planarization layer 450, and formed to be spaced apart from each other at constant intervals. An upper surface of the bottom portion 541 may be formed to be flat. An edge of the bottom portion 541 may overlap the plurality of first electrodes 510.

The first and second protrusions 542 and 543 are provided on the bottom portion 541. The first protrusion 542 may be formed on an upper surface of one side edge of the bottom portion 541, and the second protrusion 543 may be formed on an upper surface of the other side edge of the bottom portion 541, respectively. In addition, the first and second protrusions 542 and 543 are not in contact with each other.

Upper surfaces of the first and second protrusions 542 and 543 may be respectively in contact with the first electrodes 510 adjacent to each other. That is, the first protrusion 542 may be in contact with one first electrode 510 of two first electrodes 510 adjacent to each other, and the second protrusion 543 may be in contact with the other first electrode 510 of them. Therefore, the first electrodes 510 adjacent to each other may be electrically connected to each other through the plurality of first connection portions 540*a*.

The first and second protrusions 542 and 543 may be formed at the same height. In addition, the first and second protrusions 542 and 543 may be formed to be perpendicular to the bottom portion 541. Therefore, the first and second protrusions 542 and 543 may stably support the plurality of first electrodes 510.

The contact portion 540*c* is provided on the planarization layer 450 in the non-light emission area NEA. As described above in FIG. 2, one side of the contact portion 540*c* may be connected to one first electrode 510, and the other side of the contact portion 540*c* may be connected to the drain electrode 342 of the driving thin film transistor DTr.

In FIG. 3, one side of the contact portion 540*c* is protruded to be in contact with one first electrode 510, but is not limited thereto. For example, one side of the contact portion 540*c* may be extended in a direction in which the first connection portion 540*a* is formed, so that the contact portion 540*c* may be connected to the bottom portion 541 on the planarization layer 450. Therefore, one side of the contact portion 540*c* may be electrically connected to the first electrode 510 through the first protrusion 542 or the second protrusion 543 of the first connection portion 540*a*.

The plurality of first electrodes 510 are provided on the first connection portion 540*a* and the contact portion 540*c* in the light emission area EA.

The plurality of first electrodes 510 may be a single layer or multi-layer made of a metal material such as molybdenum (Mo) or titanium (Ti), or their alloy, and may be made of a transparent conductive material such as indium tin oxide (ITO) or indium zinc oxide (IZO).

The plurality of first electrodes 510 may be formed to have the same area. In addition, the plurality of first electrodes 510 may be formed to be spaced apart from each other at constant intervals, and an interval between the first electrodes 510 adjacent to each other may be smaller than a width of the bottom portion 541. In addition, a thickness of each of the plurality of first electrodes 510 may be greater than that of the connection portion 540.

A lower surface of each of the plurality of first electrodes 510 may be in contact with the first connection portion 540*a* or the contact portion 540*c*. For example, the lower surface of one of the first electrodes 510 may be in contact with one of the first protrusion 542 or the second protrusion 543 and the contact portion 540*c*. Alternatively, the lower surface of any one of the first electrodes 510 may be in contact with the first and second protrusions 542 and 543, and in this case, the first and second protrusions 542 and 543 may be formed on their respective bottom portions 541 different from each other. Alternatively, the lower surface of any one first electrode 510 may be in contact with one of the first protrusion 542 or the second protrusion 543.

The light emitting layer 520 may be provided on the first electrode 510, and may be formed on the entire surface of the display area DA. Further, sides of the light emitting layer 520 may be exposed to the non-display area NDA.

The light emitting layer 520 may include a hole transporting layer, an organic light emitting layer, and an electron transporting layer. In this case, when a voltage is applied to the first electrode 510 and the second electrode 530, holes and electrons move to the light emitting layer through the hole transporting layer and the electron transporting layer, respectively, and are combined with each other in the light emitting layer to emit light.

The light emitting layer 520 may be provided to emit white light. To this end, the light emitting layer 520 may include a plurality of stacks for emitting light of different colors.

The second electrode 530 may be formed on the light emitting layer 520, and may be formed on the entire surface of the display area DA. Further, sides of the second electrode 530 may be exposed to the non-display area NDA.

Since the light emitting display apparatus of the present disclosure is provided in a top emission mode, the second electrode 530 may be made of a transparent conductive material such as indium tin oxide (ITO) or indium zinc oxide (IZO) to transmit light emitted from the light emitting layer 520 toward an upper direction.

The color filter CF and the black matrix BM are provided on the second electrode 530. The color filter CF may be formed in the light emission area EA, and the black matrix BM may be formed in the non-light emission area NEA. In FIG. 3, the color filter CF and the black matrix BM are formed in the same layer, but are not limited thereto. For example, the black matrix BM may be formed on an upper surface or a lower surface of the color filter CF, so that a portion of the black matrix BM may overlap the color filter CF.

The color filter CF may be any one of a red color filter, a green color filter and a blue color filter. Therefore, white light emitted from the light emitting layer 520 may be converted into one of red light, green light and blue light while passing through the color filter CF.

The black matrix BM may be formed in the non-light emission area NEA to prevent light leakage from occurring between adjacent subpixels SP.

The second substrate 800 is provided on the color filter CF and the black matrix BM. Since the light emitting display apparatus of the present disclosure is provided in a top emission mode, the second substrate 800 may be made of a transparent material such as glass or plastic so as to transmit light emitted from the light emitting layer 520 toward the upper direction.

The dam 700 may be disposed between the first substrate 100 and the second substrate 800 in the non-display area NDA to bond the first substrate 100 and the second substrate 800 to each other. The dam 700 may be formed to surround the display area DA to prevent external water and hydrogen from flowing into the display area DA.

The dam 700 may be formed of a conductive material to electrically connect the low potential power voltage line EVSSL with the second electrode 530. In detail, in the non-display area NDA, the dam 700 may be formed to cover a portion of the low potential power voltage line EVSSL exposed by the buffer layer 150 and the shorting bar 14. The dam 700 may be formed to cover sides of the second electrode 530 exposed to the non-display area NDA. That is, the low power voltage line EVSSL and the second electrode 530 may be electrically connected to each other through the dam 700. Therefore, the second electrode 530 may be supplied with a low potential power voltage from the low potential power voltage line EVSS.

In this case, the partition 750 may be formed to prevent the dam 700 from flowing into the display area DA.

The partition 750 may be formed between the planarization layer 450 and the light emitting layer 520 while surrounding the edge of the display area DA. A lower surface of the partition 750 is in contact with the planarization layer 450, and an upper surface of the partition 750 may be in contact with the light emitting layer 520. Therefore, a space surrounded by the planarization layer 450, the light emitting layer 520 and the partitions 750 may be formed. At this time, the plurality of first electrodes 510 and the connection portion 540 may be formed in the space surrounded by the partitions 750.

When the partition 750 is not formed, the dam 700 is not formed only in the non-display area NDA, and may flow into the display area DA. The dam 700 flown into the display area DA may be in contact with the plurality of first electrodes 510 or the connection portion 540. As described above, since the dam 700 is formed of a conductive material, the dam 700 may be electrically connected to the plurality of first electrodes 510 or the connection portion 540.

Since the dam 700 is electrically connected to the low potential power voltage line EVSS, a low potential power voltage may be supplied to the plurality of first electrodes 510 or the connection portion 540. Alternatively, since the dam 700 is electrically connected to the second electrode 530, a short may occur between the second electrode 530 and the plurality of first electrodes 510 or the connection portion 540.

Therefore, since a power source is not normally supplied to the plurality of first electrodes 510 and the second electrode 530, the light emitting layer 520 may not emit light normally. As a result, the partition may be formed 750, so that the dam 700 may be prevented from flowing into the display area DA, thereby preventing the dam 700 from being in contact with the plurality of first electrodes 510 or the connection portion 540.

Figure 4A:
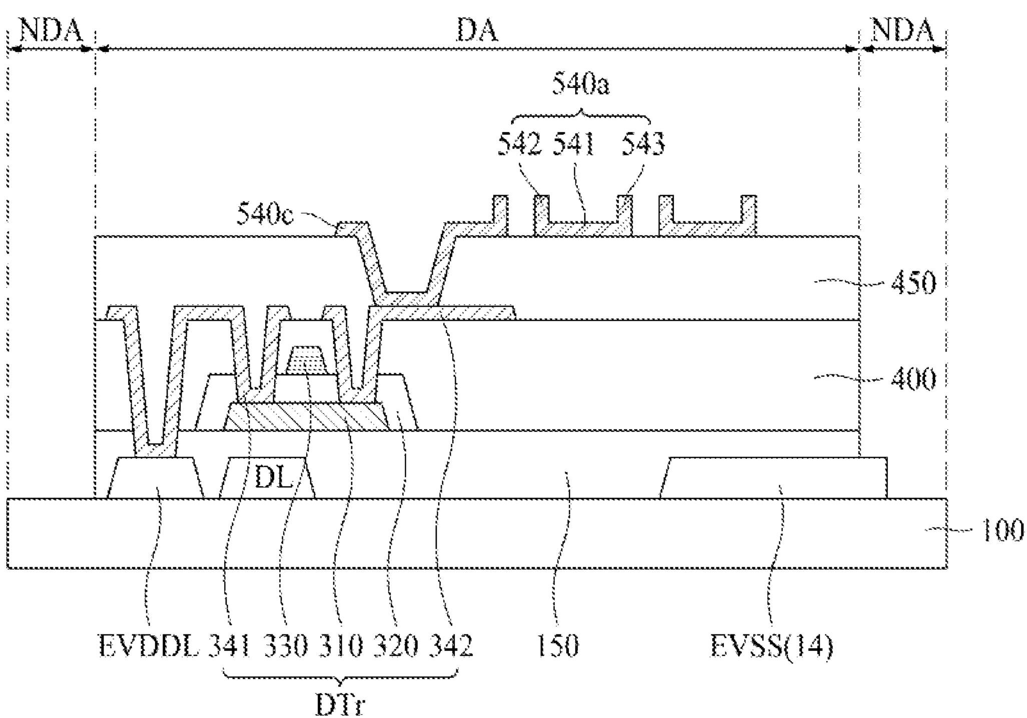
FIGS. 4A to 4C are cross-sectional views taken along line A-A' of FIG. 2, illustrating a process of manufacturing a light emitting display apparatus according to one aspect.
Figure 4B:
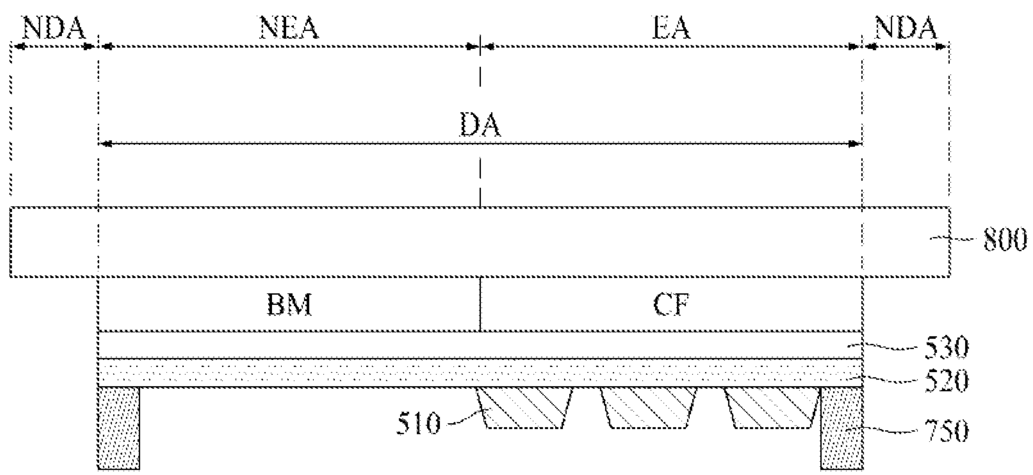
Figure 4C:
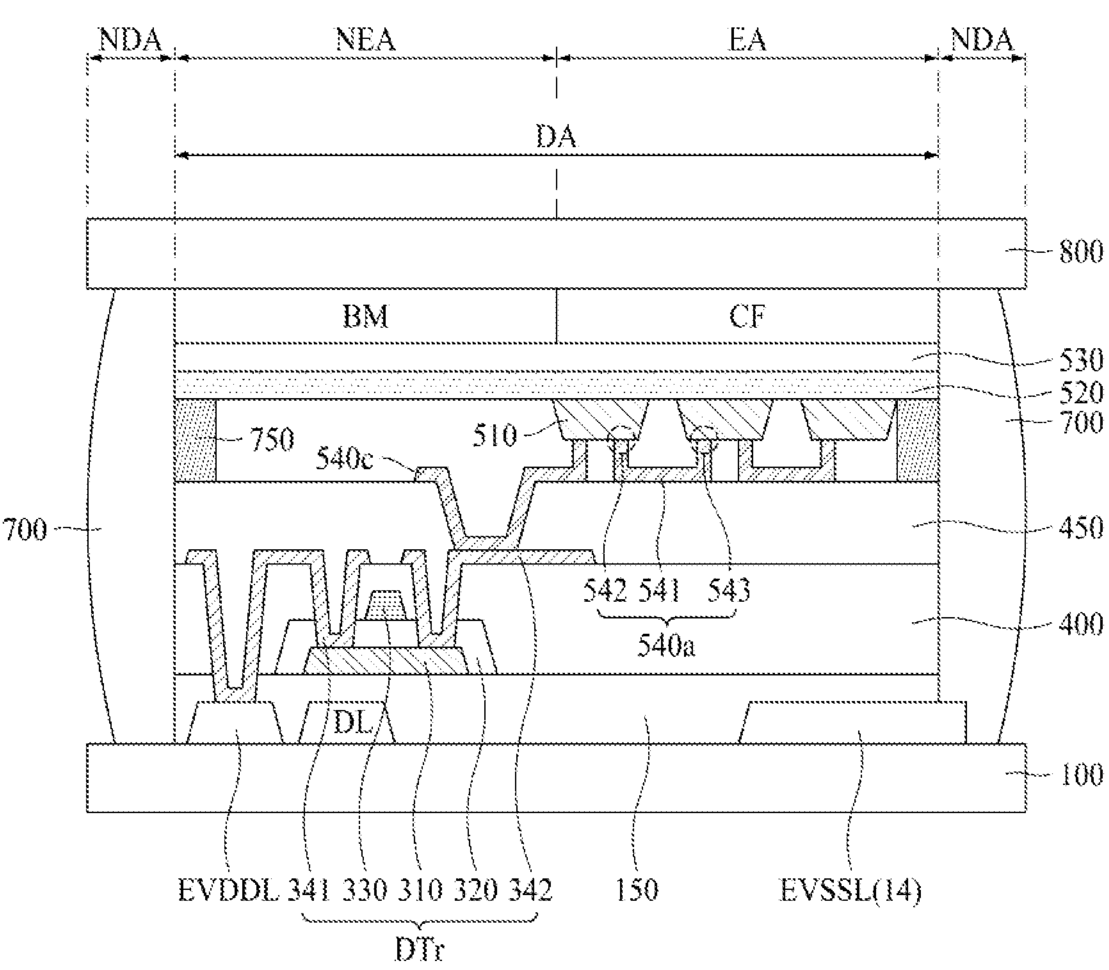

FIGS. 4A to 4C are cross-sectional views taken along line A-A' of FIG. 2, illustrating a process of manufacturing a light emitting display apparatus according to one aspect.

Referring to FIG. 4A, a high potential power voltage line EVDDL, a low potential power voltage line EVSSL, a data line DL, a buffer layer 150, a driving thin film transistor DTr and a connection portion 540 may be sequentially formed on a first substrate 100.

The high potential power voltage line EVDDL, the low potential power voltage line EVSSL, the data line DL, the buffer layer 150, the driving thin film transistor DTr and the connection portion 540 of FIG. 4A may include the same features as those disclosed in FIG. 3.

Referring to FIG. 4B, a black matrix BM, a color filter CF, a second electrode 530, a light emitting layer 520, a plurality of first electrodes 510 and a partition 750 may be sequentially formed below a second substrate 800.

The black matrix BM, the color filter CF, the second electrode 530, the light emitting layer 520, the plurality of first electrodes 510 and the partition 750 of FIG. 4B may include the same features as those disclosed in FIG. 3.

Referring to FIG. 4C, a display apparatus may be formed by bonding the first substrate 100 formed in FIG. 4A and the second substrate 800 formed in FIG. 4B to each other. After the first substrate 100 and the second substrate 800 are bonded to each other, a dam 700 may be formed in an area between the first substrate 100 and the second substrate 800 in the non-display area NDA.

Figure 5:
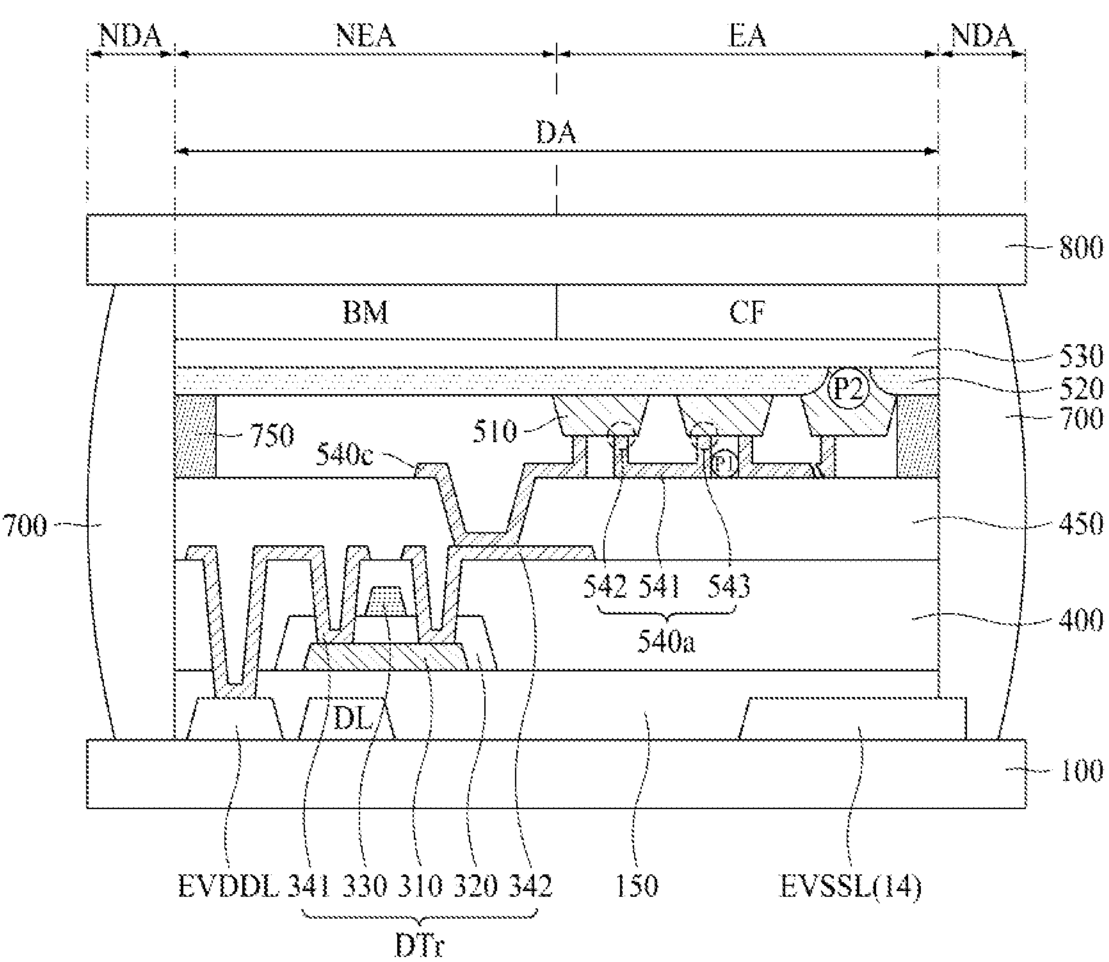
FIG. 5 is a schematic cross-sectional view illustrating that particles flow into one subpixel of a light emitting display apparatus according to one aspect of the present disclosure.

FIG. 5 is a schematic cross-sectional view illustrating that particles flow into one subpixel of a light emitting display apparatus according to one aspect of the present disclosure. First and second particles P1 and P2 may be generated during a process of forming a semiconductor device, or may be externally flown.

As shown in FIG. 5, the first particles P1 may overlap one of the first electrodes 510, and may be seated on the planarization layer 450. In the related art, the particles seated on the planarization layer 450 may be directly in contact with the first electrode 510. Therefore, the particles may pressurize the first electrode 510, and a portion of the first electrode 510 may be disconnected, whereby a problem may occur in that dark spots are formed in the subpixel. However, as shown in FIG. 5, when a height of the first particles P1 is lower than that of the first connection portion 540*a*, the first electrode 510 overlapped with the first particles P1 may be normally driven without being affected by the first particles P1. Therefore, the present disclosure discloses the first connection portion 540*a* including the first and second protrusions 542 and 543, so that occurrence of dark spots in the subpixel due to the particles formed on the planarization layer 450 may be reduced as compared with the related art.

In FIG. 5, although the first particles P1 are formed on the planarization layer 450, the same effect may be obtained even in the case that the first particles P1 are formed on the bottom portion 541.

As shown in FIG. 5, the second particles P2 may be seated on a lower portion of the second electrode 530.

The light emitting layer 520 may not be formed as a single layer continuous at the lower portion of the second electrode 530 due to a step difference between the second particles P2 and the second electrode 530. That is, in a position adjacent to the second particles P2, a portion of the light emitting layer 520 may not be continuous. Therefore, since the light emitting layer 520 is not formed to fully cover the lower portion of the second electrode 530, a portion of the light emitting layer 520 adjacent to the second particles P2 in the second electrode 530 may be exposed to the outside.

The plurality of first electrodes 510 may be formed below the light emitting layer 520, and any one of the first electrodes 510 may be formed at the lower portion of the second electrode 530, which is exposed by the light emitting layer 520. At this time, since the first electrode 510 and the second electrode 530 are made of a conductive material, the first electrode 510 and the second electrode 530 may be electrically connected to each other. That is, a short may occur due to the contact between the first electrode 510 and the second electrode 530.

In this case, a process for disconnecting the first electrode 510 and the first connection portion 540*a*, in which the short occurs, may be performed. In detail, a high voltage pulse may be applied to the first electrode 510 in which a short occurs. A degradation reaction may occur in the first electrode 510 due to the high voltage pulse. At this time, heat may be transferred to the first connection portion 540*a* that is in contact with the first electrode 510 in which the short occurs. Since a thickness of the first connection portion 540*a* is smaller than that of the first electrode 510, more heat may be concentrated on the first connection portion 540*a* than the first electrode 510. Therefore, a portion of the first connection portion 540*a* may be melted so that a portion of the first connection portion 540*a* may be disconnected. In FIG. 5, portions of the bottom portion 541 are spaced apart from each other, but the present disclosure is not limited thereto. For example, portions of the protrusions 542 and 543 may be spaced apart from each other, or areas where the bottom portion 541 is connected with the protrusions 542 and 543 may be spaced apart from each other.

Therefore, among the plurality of first electrodes 510, the first electrode 510 in which a short occurs is separated from the other first electrode 510, which is normally driven, through the connection portion 540, so that the subpixel may normally emit light by using the first electrode 510 that is normally driven.

According to the present disclosure, the following advantageous effects may be obtained.

According to the present disclosure, the plurality of first electrodes electrically connected to each other through the connection portion are formed, so that occurrence of dark spots due to particles may be minimized.

It will be apparent to those skilled in the art that the present disclosure described above is not limited by the above-described aspects and the accompanying drawings and that various substitutions, modifications and variations may be formed in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A display apparatus comprising:

a first substrate provided with a display area including a plurality of subpixels having a gate line, a data line and a power line, and a non-display area surrounding the display area;

a driving thin film transistor provided over the first substrate;

a planarization layer provided over the driving thin film transistor;

a plurality of first electrodes provided over the planarization layer;

a light emitting layer provided over the plurality of first electrodes; and a second electrode provided on the light emitting layer, wherein the plurality of first electrodes are electrically connected to one another through a connection portion disposed between the planarization layer and the plurality of first electrodes, wherein the connection portion is in contact with an upper surface of the planarization layer and a lower surface of at least one first electrode among the plurality of first electrodes, wherein the power line includes a first potential power voltage line that is extended from the display area and formed to reach the non-display area, and wherein the display apparatus further comprises:

a second substrate provided over the second electrode, and a dam provided between the first substrate and the second substrate in the non-display area, wherein the dam covers the first potential power voltage line formed in the non-display area.

2. The display apparatus of claim 1, wherein the connection portion includes:

a plurality of first connection portions connecting the plurality of first electrodes adjacent to each other among the plurality of first electrodes;

a plurality of second connection portions connecting the first connection portions adjacent to each other among the plurality of first connection portions; and a contact portion connected to a drain electrode of the driving thin film transistor.

3. The display apparatus of claim 2, wherein the gate line extends along a first direction, the data line extends along a second direction perpendicular to the first direction, the plurality of first connection portions extend along the first direction, and each of the plurality of second connection portions connects the first connection portions adjacent to each other along the second direction.

4. The display apparatus of claim 2, wherein each of the plurality of first connection portions includes:

a bottom portion formed on the planarization layer;

a first protrusion formed on an upper surface of one side edge of the bottom portion; and a second protrusion formed on an upper surface of another side edge of the bottom portion.

5. The display apparatus of claim 4, wherein, in two first electrodes adjacent to each other among the plurality of first electrodes, the first protrusion is in contact with one first electrode, and the second protrusion is in contact with another first electrode.

6. The display apparatus of claim 2, wherein one side of the contact portion is connected to one first electrode of the plurality of first electrodes, and another side of the contact portion is connected to the drain electrode of the driving thin film transistor.

7. The display apparatus of claim 1, wherein the dam is made of a conductive material.

8. The display apparatus of claim 1, further comprising a partition provided between the planarization layer and the light emitting layer in the display area, wherein the plurality of first electrodes and the connection portion are provided in a space surrounded by the partition, the planarization layer and the light emitting layer.

9. The display apparatus of claim 2, wherein the contact portion is connected to two or more of the plurality of first electrodes.

10. The display apparatus of claim 1, further comprising a shorting bar connected to the first potential power voltage line.

11. The display apparatus of claim 2, wherein each of the first connect portion has a thickness thinner than each of the first electrode.

* * * * *